US009847230B2

(12) United States Patent
Karpman et al.

(10) Patent No.: US 9,847,230 B2
(45) Date of Patent: Dec. 19, 2017

(54) METHOD AND APPARATUS FOR USING UNIVERSAL CAVITY WAFER IN WAFER LEVEL PACKAGING

(71) Applicant: The Charles Stark Draper Laboratory, Inc., Cambridge, MA (US)

(72) Inventors: Maurice Karpman, Cambridge, MA (US); Michael Rickley, Cambridge, MA (US); Andrew Mueller, Cambridge, MA (US); Nicole Mueller, Cambridge, MA (US); Jeffrey Thompson, Cambridge, MA (US); Charles Baab, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/177,723

(22) Filed: Jun. 9, 2016

(65) Prior Publication Data
US 2016/0365321 A1    Dec. 15, 2016

Related U.S. Application Data

(60) Provisional application No. 62/173,196, filed on Jun. 9, 2015.

(51) Int. Cl.
*H01L 21/3065* (2006.01)
*B81C 1/00* (2006.01)
(Continued)

(52) U.S. Cl.
CPC ........ *H01L 21/3065* (2013.01); *B81B 7/0077* (2013.01); *B81C 1/00825* (2013.01);
(Continued)

(58) Field of Classification Search
CPC ... H01L 21/3065; H01L 21/565; H01L 23/13; H01L 23/5389; H01L 23/147; H01L 24/96
See application file for complete search history.

(56) References Cited

U.S. PATENT DOCUMENTS 6,420,201 B1 *   7/2002   Webster ............... G01L 9/0054
                                                   257/E21.504
6,492,203 B1 *  12/2002   Wakashima ........ H01L 21/4803
                                                   257/E23.004
(Continued)

OTHER PUBLICATIONS

Hsu, C.H., et al., Micromachined structures fabricated using a wafer-bonded sealed cavity process. Solid-State Sensor and Actuator Workshop, Hilton Head, South Carolina, Jun. 13-16, 1994, pp. 151-155.

*Primary Examiner* — Nathan W Ha
(74) *Attorney, Agent, or Firm* — Nutter McClennen & Fish LLP; John J. Penny, Jr.

(57) ABSTRACT

An electronics module assembly is described herein that packages dies using a universal cavity wafer that is independent of electronics module design. In one embodiment, the electronics module assembly can include a cavity wafer having a single frontside cavity that extends over a majority of a frontside surface area of the cavity wafer and a plurality of fillports. The assembly can also include at least one group of dies placed in the frontside cavity and encapsulant that secures the position of the at least one group of dies relative to the cavity wafer. Further, a layer of the encapsulant can cover a backside of the cavity wafer.

8 Claims, 7 Drawing Sheets

(51) Int. Cl.
*B81B 7/00* (2006.01)
*H01L 23/13* (2006.01)
*H01L 21/56* (2006.01)
*H01L 23/538* (2006.01)
*H01L 23/00* (2006.01)
*H01L 23/14* (2006.01)

(52) U.S. Cl.
CPC ............ *H01L 21/565* (2013.01); *H01L 23/13* (2013.01); *H01L 23/5389* (2013.01); *H01L 24/96* (2013.01); *H01L 24/97* (2013.01); *B81C 2203/0154* (2013.01); *H01L 23/147* (2013.01); *H01L 2224/04105* (2013.01); *H01L 2224/73267* (2013.01); *H01L 2924/157* (2013.01); *H01L 2924/1579* (2013.01); *H01L 2924/15151* (2013.01); *H01L 2924/15156* (2013.01); *H01L 2924/15787* (2013.01); *H01L 2924/3511* (2013.01)

(56) References Cited

U.S. PATENT DOCUMENTS

| | | | |
|---|---|---|---|
| 6,495,914 B1* | 12/2002 | Sekine | H01L 23/5389 |
| | | | 257/706 |
| 7,727,806 B2 | 6/2010 | Uhland et al. | |
| 8,535,984 B2* | 9/2013 | Racz | H01L 21/6835 |
| | | | 257/E21.502 |
| 9,396,300 B2* | 7/2016 | Wang | G06F 17/5077 |
| 2005/0184304 A1 | 8/2005 | Gupta et al. | |
| 2008/0315398 A1* | 12/2008 | Lo | H01L 23/3675 |
| | | | 257/693 |
| 2013/0323884 A1* | 12/2013 | Karpman | H01L 21/78 |
| | | | 438/113 |
| 2015/0181709 A1 | 6/2015 | Tepolt et al. | |
| 2016/0049383 A1 | 2/2016 | Woychik et al. | |
| 2016/0343652 A1 | 11/2016 | Karpman et al. | |

\* cited by examiner

METHOD AND APPARATUS FOR USING UNIVERSAL CAVITY WAFER IN WAFER LEVEL PACKAGING

CROSS-REFERENCE TO RELATED APPLICATION

This disclosure claims the benefit of U.S. Provisional Patent Application No. 62/173,196, filed Jun. 9, 2015. The entire contents of this application are incorporated by reference herein.

FIELD

This disclosure relates generally to wafer fabrication and processing, and, more particularly, to reconstructed wafer techniques involving cavity wafers.

BACKGROUND

Wafer-level packaging is the technology of packaging one or more electronic modules as part of a wafer, in contrast to the conventional method of slicing the wafer into individual circuits and then packaging them. Reconstructed wafers, including high density electronic devices, are typically formed by fabricating a silicon wafer with embedded electronic modules (e.g., chip scale components) using a molding process. Most embedded chip scale components, referred to as electronic modules, include various circuitry contained within a housing and electrical contacts along one surface or another of the housing. During the molding process, the desired chip scale components (i.e., dies) are typically oriented on a mounting surface with the electrical contacts facing upward or downward relative to the mounting surface.

Integrated ultra-high density (iUHD) manufacturing and packaging processes are reconstructed wafer-level packaging processes that allow for miniaturization of electronic components. Such processes typically involve placement of individual dies face down on a mounting surface, such as an adhesive film, prior to a molding process. A cavity wafer can be created by patterning and etching a standard silicon (Si) wafer. The one or more cavities formed in the wafer can be configured to accept buried components. The cavity wafer can have a plurality of fillports, which can be distributed in each of the cavities. The cavity wafer can be placed over the dies and low coefficient of thermal expansion (CTE) encapsulant can be injected into the cavities through the fillports to surround the die. Following encapsulation, the adhesive film can be removed to reveal a planar surface on the reconstructed wafer. Multilayer interconnect can then be fabricated on both sides of the core using standard wafer fabrication techniques.

Figure 1:
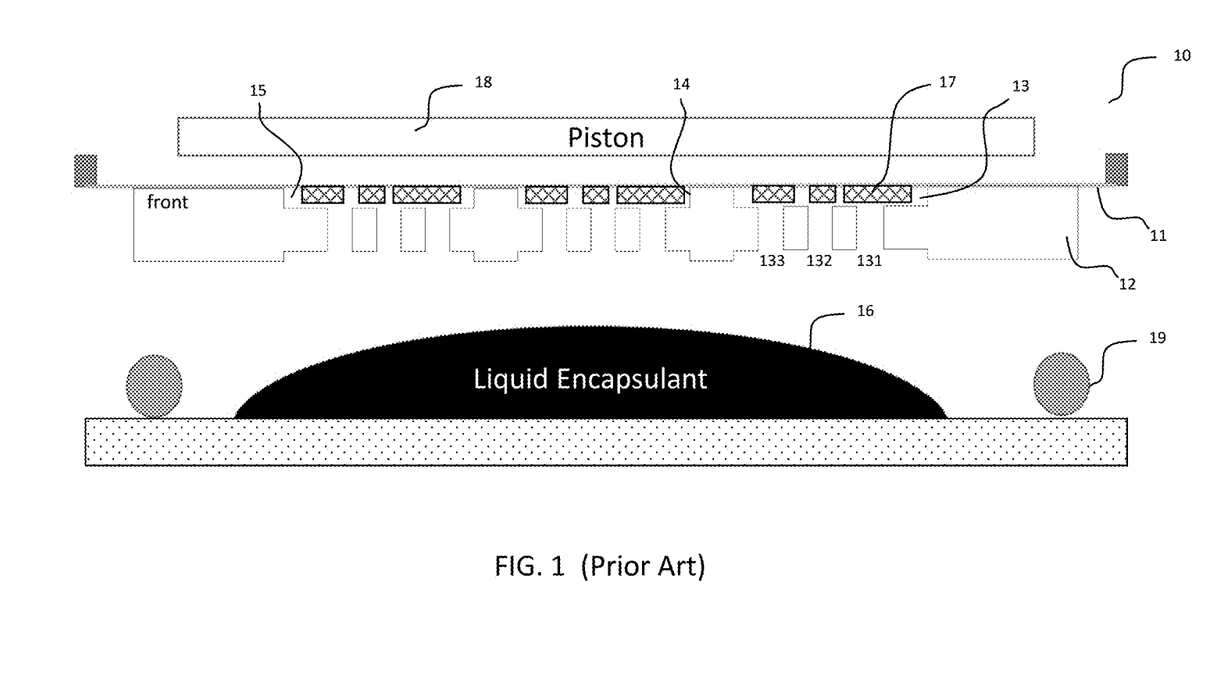
FIG. 1 illustrates a cross-sectional view of a molding process for wafer level packaging using a conventional custom cavity wafer.

FIG. 1 shows one embodiment of a molding process for wafer-level packaging 10 using a conventional custom cavity wafer. One or more dies 17 can be placed on a film 11. A cavity wafer 12 can be placed over the dies. The cavity wafer can have one or more frontside cavities 13, 14, 15. A piston 18 forces down the upper part (the film 11, the dies 17, and the cavity wafer 12) of the package into a liquid encapsulant 16. Before the molding process starts, a molding chamber (not shown) where the molding process is performed can be evacuated. As pressure is applied by the piston 18, the encapsulant 16 can flow through fillports 131, 132, 133 of the cavities 13, 14, 15. The liquid encapsulant 16 can reach the cavities and surround the dies 17. Gaskets 19 can serve as mechanical stops to avoid applying too much pressure, e.g., to the level that the dies contact the walls of the wafer cavities. It can be desirable to leave space between the dies and the walls of the wafer cavity of at least about 50 µm to allow the encapsulant 16 to flow between the dies and the walls of the wafer cavity and surround the dies completely. Spacing less than about 50 µm can, in some embodiments, be too narrow to allow particles of the encapsulant 16 to flow without restriction. Once the mold has been pressurized, heat can be applied to the wafer-level packaging to cure the liquid encapsulant 16. When the liquid encapsulant 16 is cured, the film 11 can be removed, along with excess encapsulant.

Figure 2A:
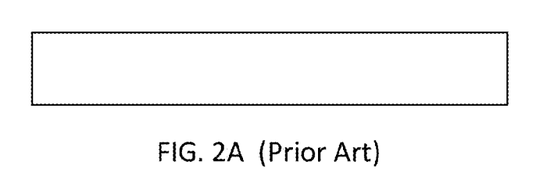
FIG. 2A illustrates a cross-sectional view of a standard wafer design.
Figure 2B:
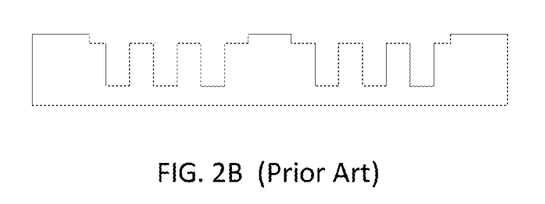
FIG. 2B illustrates a cross-sectional view of a conventional custom cavity wafer design with frontside cavities and fillports.
Figure 2C:
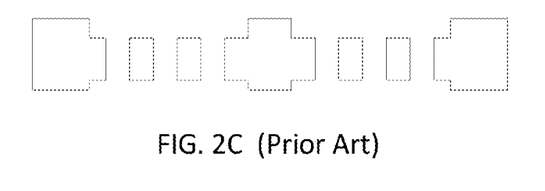
FIG. 2C illustrates a cross-sectional view of another conventional custom cavity wafer design with frontside cavities, backside cavities, and fillports.
Figure 2D:
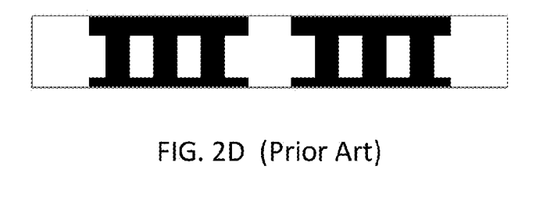
FIG. 2D illustrates a cross-sectional view of another conventional custom cavity wafer filled with encapsulant.

FIGS. 2A-2D illustrate a cross-sectional view of conventional custom cavity wafer design. A standard silicon (Si) wafer, shown in FIG. 2A, can be etched to form fillports and cavities, as shown in FIGS. 2B and 2C. After encapsulant flows through the fillports, the encapsulant can fill the fillports and the cavities as shown in FIG. 2D.

Due to a CTE mismatch between the encapsulant and the silicon wafer, bowing of the wafer can occur when heat is applied to cure the encapsulant 16. In order to control the amount of wafer bow, backside cavities can be etched in some embodiments, as shown in FIG. 2C. These backside cavities can create oppositely-directed bowing forces that can balance those created on the frontside of the wafer.

Figure 2E:
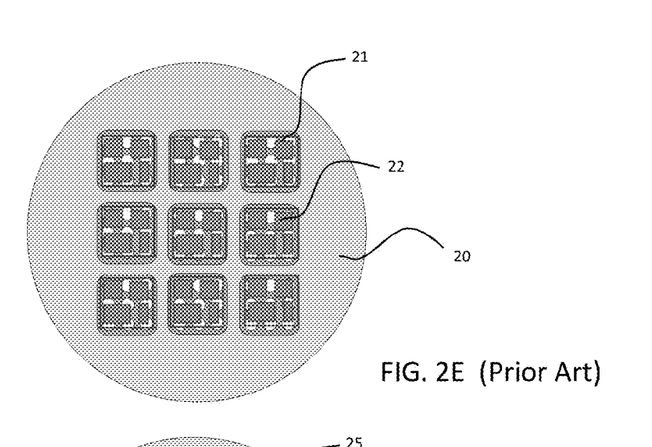
FIG. 2E illustrates a top view of the conventional custom cavity wafer design of FIG. 2D.
Figure 2F:
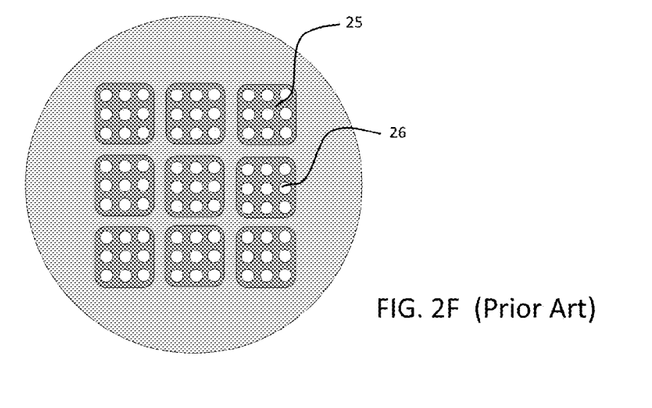
FIG. 2F illustrates a top view of the conventional custom cavity wafer design of FIG. 2E.

A group of dies can form a module in which the dies are electrically connected by the iUHD process, as shown in FIG. 2E. Conventionally, cavities are created for each module 21, 22 by etching into the wafer 20, as shown in FIG. 2F. The layout of each module can vary and a custom cavity wafer can be required for each module design.

In the conventional approach, since separate cavities are formed for each module, large gaps are formed between modules that consume valuable real-estate of the wafer. In addition, cavity wafer design that is specific to module design prevents fabrication of the cavity wafer until a corresponding module design is complete. This limitation creates issues with production schedules because each cavity wafer is essentially a custom component.

SUMMARY

In view of the above, there is a need for improved cavity wafer design for embedding dies that can be used for different module designs, and can be manufactured before module designs are completed.

In one aspect, an electronics module assembly for packaging dies using a double-sided open cavity wafer is featured. The double-sided open cavity wafer comprises a single frontside cavity that extends over a majority of a frontside surface area of the cavity wafer, a single backside cavity, and a plurality of fillports. The electronics module assembly comprises the cavity wafer, at least one group of dies, where the dies are placed in the frontside cavity, and encapsulant that fills the frontside cavity, the backside cavity, and the fillports, wherein the encapsulant secures the position of the at least one group of dies relative to the cavity wafer.

In another aspect, an electronics module assembly that packages dies using a hybrid single-sided open cavity wafer is featured. The hybrid single-sided open cavity wafer has a single frontside cavity that extends over a majority of a frontside surface area of the cavity wafer and a plurality of fillports. The electronics module assembly comprises the cavity wafer, at least one group of dies, where the dies are placed in the frontside cavity, and encapsulant that fills the frontside cavity and the fillports, wherein the encapsulant secures the position of the at least one group of dies relative to the cavity wafer. Remaining liquid encapsulant forms a uniform layer of the encapsulant covering a backside of the cavity wafer.

In yet another aspect, a method of forming an electronics module assembly is featured. The method comprises creating a cavity wafer by etching a wafer to form a single frontside cavity that extends over a majority of a frontside surface area of the wafer and a plurality of fillports, placing at least one group of dies in the frontside cavity; and flowing encapsulant from the backside of the cavity wafer through the fillports and into the frontside cavity to surround the at least one group of dies.

In other examples, any of the above aspects, or any system, method, and apparatus described herein, can include one or more of the following features.

The dies in the at least one group of dies can be interconnected to form an electronic module.

The frontside cavity can be bounded by a full thickness perimeter rim of the cavity wafer.

The plurality of fillports can be distributed throughout a fillport area that is an area corresponding to the frontside cavity.

The cavity wafer can be made of any rigid material that tolerates 230° C. process temperature.

A portion of the fillport area can be further cut out and the frontside cavity extends to the space formed by cutting out the portion of the fillport area.

A thickness of the layer of the encapsulant covering the backside of the cavity wafer can be determined to minimize wafer bow caused by encapsulant in the frontside cavity.

After a method of forming an electronics module assembly is performed, additionally the steps of applying heat to the electronics module assembly to cure the encapsulant and removing excess encapsulant to the point that the encapsulant fills the backside cavity can be performed.

After a method of forming an electronics module assembly is performed, additionally the step of removing a backside of the cavity wafer to expose the fillports can be performed. Then, the steps of applying heat to the electronics module assembly to cure the encapsulant, removing excess encapsulant from the backside of the cavity wafer to form a uniform layer of the encapsulant on the backside of the cavity wafer can be performed.

After a method of forming an electronics module assembly is performed, when a uniform layer of the encapsulant is formed on the backside of the cavity wafer, the additional step of removing the layer of encapsulant on the backside of the cavity wafer to reduce bowing from the encapsulant in the frontside cavity can be performed. Then, another additional step of removing a portion of the cavity wafer at the backside with a uniform thickness to further reduce bowing from the encapsulant in the frontside cavity can be performed.

It should be appreciated that the present technology can be implemented and utilized in numerous ways, including without limitation as a process, an apparatus, a system, a device, a method for applications now known and later developed or a computer readable medium.

Other aspects and advantages of the invention can become apparent from the following drawings and description, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DESCRIPTION

The present disclosure overcomes many problems associated with conventional custom cavity design in lamination based printed circuit boards (PCBs) and iUHD applications. Various advantages and other features of the structures and methods disclosed herein will become more readily apparent to those having ordinary skill in the art from the following detailed description of certain preferred embodiments taken in conjunction with the drawings which set forth representative embodiments of the present disclosure and wherein like reference numerals identify similar structural elements.

All relative descriptions herein such as left, right, up, and down are with reference to the figures and are not meant in a limiting sense. Additionally, for clarity common items and circuitry such as integrated circuits, resistors, capacitors, transistors, and the like, have not been included in the figures, as can be appreciated by those of ordinary skill in the art. Unless otherwise specified, the illustrated embodiments can be understood as providing example features of varying detail of certain embodiments and, therefore, unless otherwise specified, features, components, modules, elements, and/or aspects of the illustrations can be combined, interconnected, sequenced, separated, interchanged, positioned, and/or rearranged without materially departing from the disclosed systems or methods. Additionally, the shapes and sizes of components are also exemplary and, unless otherwise specified, can be altered without materially affecting or limiting the disclosure.

In one embodiment, an electronics module assembly that packages dies using a cavity wafer is described. The electronics module assembly can include a cavity wafer that comprises a frontside cavity, a backside cavity, and a plurality of fillports, at least one group of dies being placed in the frontside cavity, and liquid encapsulant that flows from the backside of the cavity wafer, passes through the fillports, and surrounds the at least one group of dies.

Figure 3A:
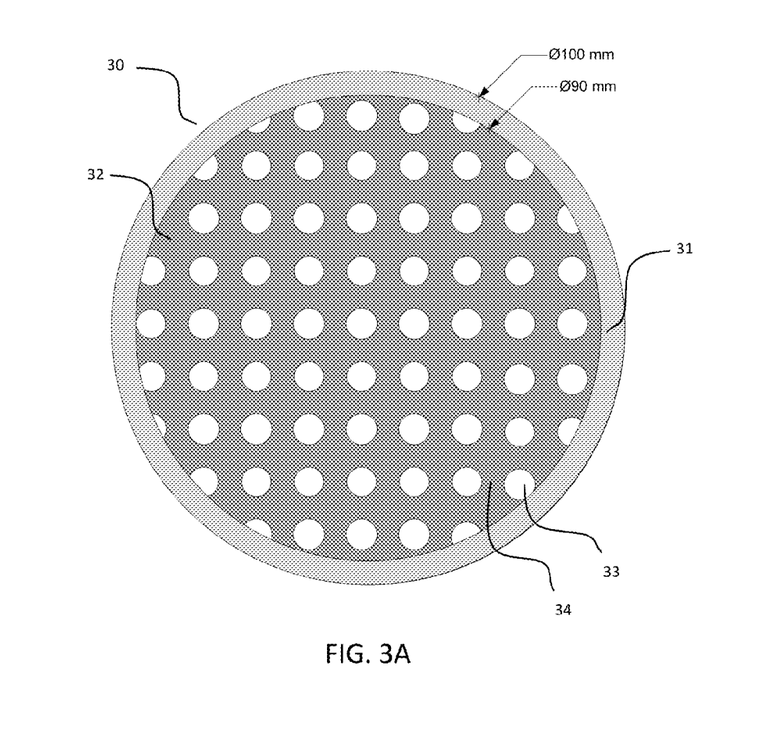
FIG. 3A illustrates a top view of one embodiment of a cavity wafer according to the teachings disclosed herein.

FIG. 3A illustrates a top view of one embodiment of a double-sided open cavity wafer in accordance with the teachings disclosed herein. The illustrated double-sided open cavity wafer 30 can have a diameter of about 100 mm. The double-sided open cavity wafer 30 can have a single open cavity 32 that occupies the entire area of the cavity wafer except for a perimeter rim 31. In contrast, conventional cavity wafers, such as wafer 20 shown in FIGS. 2A-2F, have a plurality of cavities specifically designed to accommodate particular die components. In one embodiment, the open cavity 32 can have a diameter of about 90 mm, which leaves the perimeter rim 31 with a width of about 10 mm. To prevent deformation of the perimeter rim 31, the cavity 32 can be bounded by webbing of wafer material and fillports 33. In one embodiment, a diameter of each fillport 33 of the open cavity wafer 30 can be about 1 mm. Moreover, the fillports can be separated from one another by about 1 mm. Accordingly, a cavity wafer 30 having a diameter of about 100 mm can have about 2000 fillports in one embodiment.

Figure 3B:
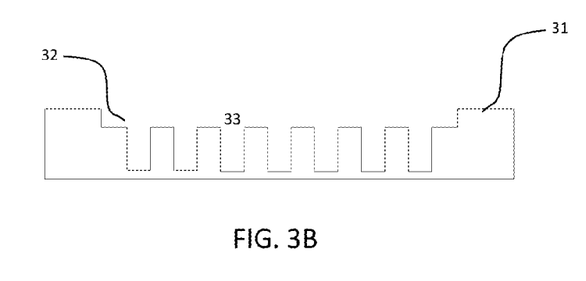
FIG. 3B illustrates a cross-sectional view of the cavity wafer of FIG. 3A following the frontside cavity processing.
Figure 3C:
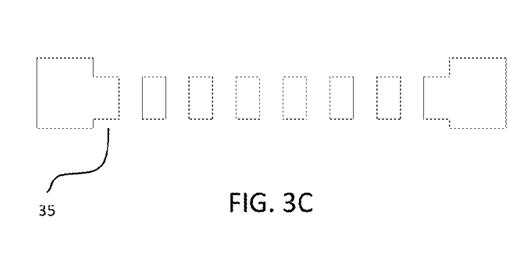
FIG. 3C illustrates a cross-sectional view of the cavity wafer of FIG. 3A following the backside cavity processing.

FIGS. 3B-3C illustrate cross-sectional views of the cavity wafer 30 during various processing stages. For example, FIG. 3B shows initial processing steps of etching the fillports 33 and a frontside cavity 32. In one embodiment, the fillports and the frontside cavity can be etched using a deep reactive-ion etching (DRIE) process. Next, a backside cavity 35 can be etched on an opposite side of the wafer 30 using a similar process. In other embodiments, however, any of a variety of other semiconductor fabrication techniques can be used to form the fillports, the frontside cavity, and the backside cavity. These can include, for example, mechanical milling or even additive manufacturing processes that build the wafer via molding or deposition of successive layers of material. Moreover, it can be possible to form the wafer from materials other than silicon, e.g., alumina, high temperature polymers, etc.

The open cavity 62 can have a depth that the dies can be placed inside of the open cavity. For example, when the dies have a usual thickness of 150 μm with +/−25 μm, the open cavity can have a depth of about 220 μm so that there is enough clearance of about 50 μm between the dies and the cavity wafer. This design can make the cavity wafer tolerant of varying die thicknesses. Alternately, if a die with unusual thickness is required to be placed in the cavity, a portion of the cavity area can be cut to accommodate the thick die. This alternate embodiment is described in detail below.

Figure 4:
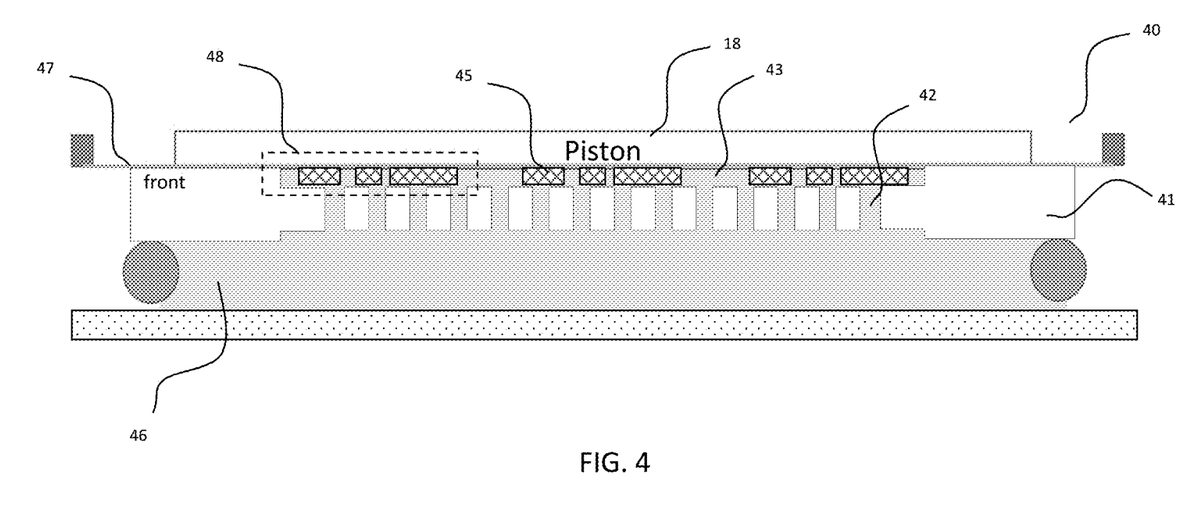
FIG. 4 illustrates a cross-sectional view of one embodiment of a molding process using a double-sided open cavity wafer in accordance with embodiments disclosed herein.

FIG. 4 illustrates a cross-sectional view of one embodiment of a molding process using a double-sided open cavity wafer. As described above with reference to FIG. 1, when pressure is applied to the upper part of the wafer-level packaging by the piston 18, liquid encapsulant 46 can flow through fillports 42 of an open cavity 43 and surround dies 45 disposed within the cavity. In one embodiment, epoxy molding compound or silica filled epoxy can be used as the liquid encapsulant 46. Any molding compound can be used, however, if the compound has liquid characteristics to permit flow through the fillports and around the dies. A group of dies 45 can form a module or an electronic circuit 48. Unlike the above-described conventional approaches, each module is not disposed in a separate cavity formed to specifically define and house the module. Instead, each module 48 is defined solely by placement of the dies 45 and by the iUHD interconnect that is formed on the front and/or back sides of the wafer post-molding.

Figure 5A:
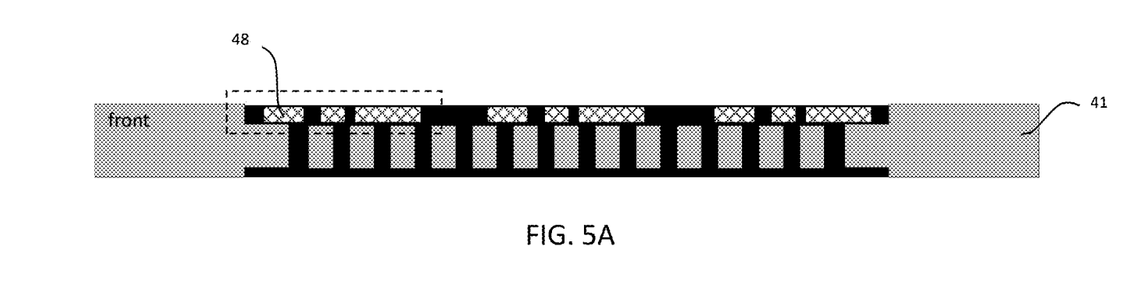
FIG. 5A illustrates a cross-sectional view of one embodiment of wafer-level packaging from a molding process using a double-sided open cavity wafer in accordance with embodiments disclosed herein.
Figure 5B:
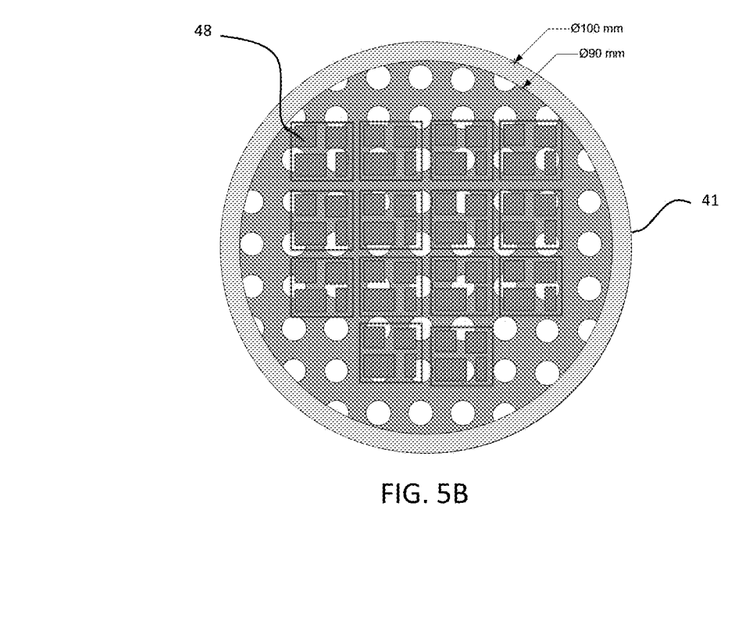
FIG. 5B illustrates a top view of the wafer-level packaging of FIG. 5A.

FIGS. 5A-5B illustrate various views of wafer-level packaging from the above-described molding process using a double-sided open cavity wafer. Referring to FIG. 5A, the film 47 can be removed to expose the dies for formation of a frontside interconnect using known fabrication techniques. Further, any excess encapsulant can be removed from the backside of the wafer using conventional techniques, such as chemical or mechanical processing. Accordingly, a cavity wafer that embeds dies is created that is ready for further processing.

In another embodiment, additional layer(s) of dies can be placed upon the first layer of the dies, according to the iUHD process. Related packaging methods are described in, for example, U.S. Pat. No. 7,727,806, U.S. Patent Publication No. 2015/0181709, and U.S. patent application Ser. No. 15/160,303.

Referring to FIG. 5B, the various groupings of dies that form electronic modules 50 can be readily seen. As shown in the figure, the wafer can have a plurality of such modules held in position by encapsulant. Once interconnection among the dies is performed, the modules can be cut into a plurality of individual packages using conventional techniques.

A double-sided open cavity wafer according to the present disclosure does not have cavities specific to a certain module design. This can allow the open cavity wafer to support any module design because the open cavity wafer has enough fillports to produce encapsulant flow around any layout of the dies. For example, in one embodiment, a cavity wafer having a diameter of about 100 mm can have about 2000 fillports. This high density of fillports can support any placement of dies in the open cavity.

In addition, since there is no need to tailor areas of the wafer for each module, a single stock wafer can be utilized for a variety of applications, thereby allowing fabricators to stock a single part. Further, wasted wafer real estate between conventional custom cavities can be reclaimed and modules can be more closely laid out on the wafer, increasing component density and manufacturing efficiency. Accordingly, an open cavity wafer is likely to hold more modules than a conventional custom cavity wafer of the same size.

Figure 6A:
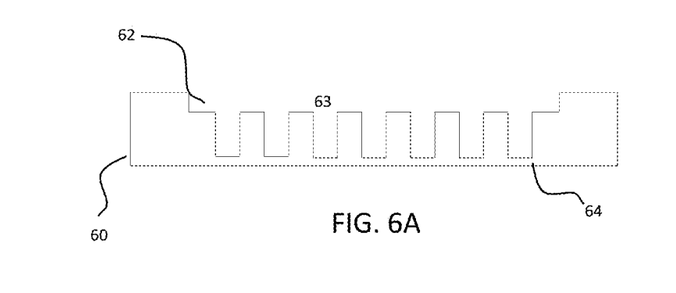
FIG. 6A illustrates a cross-sectional view of another embodiment of a cavity wafer according to the teachings disclosed herein.
Figure 6B:
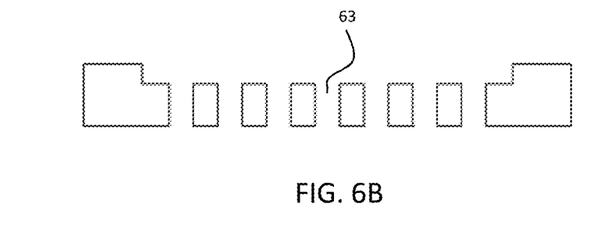
FIG. 6B illustrates a cross-sectional view of the cavity wafer of FIG. 6A following backside processing.
Figure 6C:
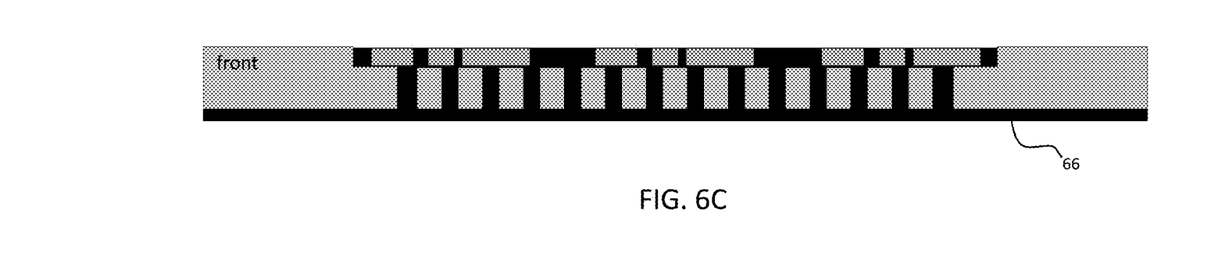
FIG. 6C illustrates a cross-sectional view of the cavity wafer of FIG. 6B following encapsulation.

FIGS. 6A-6C illustrate cross-sectional views of other embodiments of a cavity wafer according to the teachings of the present disclosure. This hybrid single sided open cavity wafer 60 can include a frontside cavity 62 and a flat backside 64 (i.e., "single sided"). As shown in FIG. 6A, fabrication of such a wafer can include initial steps of etching or otherwise forming fillports 63 and frontside cavity 62, similar to the process described above in connection with FIG. 3B. Instead of creating a backside cavity as in FIG. 3C, however, the hybrid single sided open cavity wafer can have a flat surface 64 at the backside. This flat surface 64 can be processed chemically or mechanically to expose the fillports 63, as shown in FIG. 6B. In such an embodiment, liquid encapsulant can be left on the backside of the wafer and can serve a similar purpose as the above-described backside cavity to counteract wafer bowing forces from the encapsulant in the frontside cavity. Such embodiments have an additional advantage of eliminating an etching step to create a backside cavity.

Referring to FIG. 6A-6B and as noted above, fillports 63 and a frontside cavity 62 can be created by etching processes. In one embodiment, the fillports and the frontside cavity can be etched using a deep reactive-ion etching (DRIE) process. However, any semiconductor fabrication techniques can be used to form the fillports and the frontside cavity. Instead of creating a backside cavity, the entire backside 64 of the cavity wafer 60 can be cut or otherwise processed to expose the fillports 63, as shown in FIG. 6B. During an injection step similar to that depicted in FIG. 4, liquid encapsulant can flow through fillports 63 into the frontside cavity 62. Referring FIG. 6C, after heat is applied to the cavity wafer 60 to cure the encapsulant, excess encapsulant can be removed by mechanical or other processing. For the illustrated hybrid single-sided open cavity wafer, a layer of the encapsulant 66 can be intentionally left on the backside 64 in some embodiments.

A thickness of the backside encapsulant layer 66 can impact the amount of wafer bow, as a mismatch between the CTE of the encapsulant and the wafer body can create bowing forces in the same way that encapsulant in the frontside cavity does. Because the bowing forces created on the frontside of the wafer can be oppositely directed from those created on the backside, they can be balanced to offset one another. Accordingly, the thickness of the encapsulant layer 66 can be set to minimize wafer bow or impart a desired amount of wafer bow in either direction. For example, in a case where it is known that further processing steps will induce new bowing forces in one direction, a desired amount of bow in an opposite direction can be created using the backside encapsulant layer 66. In other embodiments, however, it may be desirable to eliminate the entire backside encapsulant layer 66 by removing it chemically or mechanically and also part of entire backside of the cavity wafer. In some embodiments, a thickness of the backside encapsulant layer 66 can be in a range from about +100 µm to about −100 µm, where a negative number can mean that the entire backside encapsulant layer is removed and some of the backside of the cavity wafer is also removed corresponding to the thickness.

Embodiments utilizing the above-described hybrid single-sided open cavity wafer architecture can have reduced production time and cost when compared to a double-sided open cavity wafer because one less etching step is required (i.e., there is no need to create a backside cavity). In addition, the thickness of the backside encapsulant layer 66 can be precisely adjusted, which results in better control of wafer bow.

Figure 7:
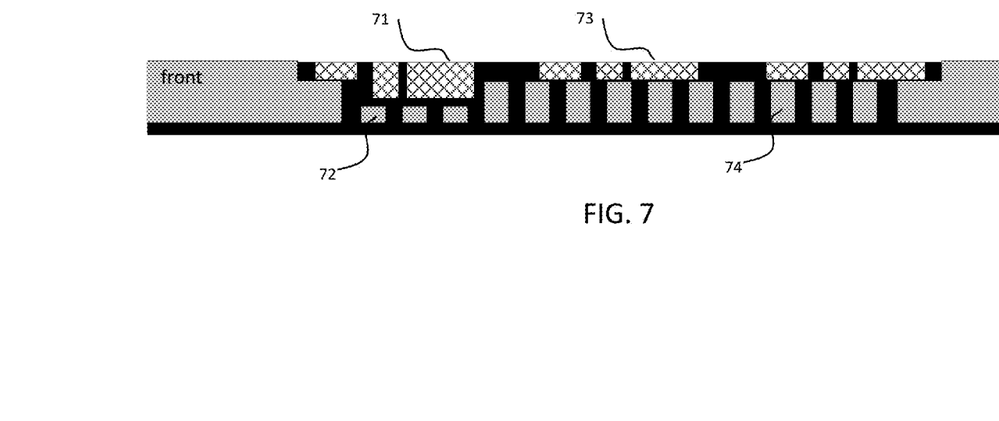
FIG. 7 illustrates a cross-sectional view of one embodiment of a cavity wafer that supports thicker dies according to the teachings disclosed herein.

FIG. 7 illustrates a cross-sectional view of one embodiment of a cavity wafer that supports thicker dies. In some microelectromechanical systems (MEMS), for example, several dies can be about 150 µm in thickness but one or more other components can be thicker, e.g., in a range from about 500 µm to about 700 µm. Such a die cannot be buried in a frontside cavity in some embodiments, as the component thickness is greater than a dimension of the cavity. Contact between the component and the cavity ceiling or other wall can be undesirable, as can be a gap between the component and the cavity wall that is too narrow to permit particles of encapsulant to flow therebetween (e.g., silica particles when using a silica filled epoxy encapsulant). In some embodiments, for example, it can be desirable to leave a clearance between a cavity ceiling or other wall and a die that is at least about 50 µm.

In an embodiment in which thicker dies are combined with thinner dies, a portion of a cavity can be cut out to accommodate the thicker dies. Referring to FIG. 7, certain dies 71 are thicker than other dies 73. The thicker dies 71 can be placed at an area where a cavity wall is cut to give the frontside cavity greater depth. As the area 72 is cut and has more space than other area 74, thicker dies 71 can be placed at the area. The feature of cut-outs of a portion of open cavity can be implemented in some embodiments as an additional feature to the above-described double-sided open cavity wafer and hybrid single-sided open cavity wafer. Removing material from the webbing of wafer material and fillports that spans the cavity wafer can be easily accomplished using, for example, laser or other etching, as well as a variety of other processing techniques known in the art. Removing material from particular areas of a cavity wafer can require custom wafer processing, but still has the advantage of starting from the universal cavity wafer designs described herein and requires routine processing that can be performed without special procedures. This means fabricators can still stock a single universal cavity wafer and easily arrange any desired configuration of dies thereon.

While the above-described embodiments illustrate a circular wafer and cavity, the open cavities described herein are not limited to a round shape. In other embodiments, for example, the open cavity can have other shapes, such as a rectangular shape or a square shape.

Moreover, and as mentioned above, cavity wafers are not limited to silicon construction. In some embodiments, a cavity wafer can be made of any rigid material that can tolerate 230° C. process temperatures. For example, a cavity wafer can be molded or cast using high temperature polymers such as filled epoxies, filled cyanide esters of Polyaryletherketone, ceramics such as alumina, or metal. Other manufacturing processes can be employed as well, such as additive manufacturing processes that build up a wafer from a plurality of layers of deposited material.

In some embodiments, a large diameter (e.g., about 300 mm or more) cavity wafer can include a full thickness post disposed, e.g., at the center of the cavity wafer. The full thickness post can be an area that does not have fillports and can serve to prevent the wafer from flexing during the mold process.

In view of the above, it will be appreciated that the open cavity wafer according to the present disclosure can increases the number of modules included in a cavity wafer. The open cavity wafer can help simplify manufacturing processes and reduce costs because open cavity wafers are independent of module design and a single design can accommodate a plurality of circuit designs. Accordingly, a larger number of cavity wafers can be manufactured, thereby reducing manufacturing cost per cavity wafer. Furthermore, the open cavity wafer enables flexible manufacturing scheduling because the cavity wafer can be produced completely independently of module design (e.g., before a module design is done).

While the foregoing description has been directed to specific embodiments, it will be apparent that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments described herein. Finally, all publications and references cited herein are expressly incorporated by reference in their entirety.

What is claimed is:

1. A method for forming an electronics module assembly, the method comprising:
   creating a cavity wafer by etching a wafer to form a single frontside cavity that extends over a majority of a frontside surface area of the cavity wafer and a plurality of fillports;
   placing at least one group of dies in the single frontside cavity; and
   flowing encapsulant from a backside of the cavity wafer through the fillports and into the single frontside cavity to surround the at least one group of dies.

2. The method of claim 1, further comprising etching a single backside cavity in the cavity wafer.

3. The method of claim 1, further comprising
   applying heat to the electronics module assembly to cure the encapsulant; and
   removing excess encapsulant to the point that the encapsulant fills the backside cavity.

4. The method of claim 1, further comprising removing a backside of the cavity wafer to expose the fillports.

5. The method of claim 4, further comprising:
   applying heat to the electronics module assembly to cure the encapsulant; and
   removing excess encapsulant from the backside of the cavity wafer to form a uniform layer of the encapsulant on the backside of the cavity wafer.

6. The method of claim 5, wherein a thickness of the layer of encapsulant on the backside of the cavity wafer is determined to reduce bowing from encapsulant in the frontside cavity.

7. The method of claim 5, further comprising:
   removing the layer of encapsulant on the backside of the cavity wafer to reduce bowing from the encapsulant in the frontside cavity.

8. The method of claim 7, further comprising:
   removing a portion of the cavity wafer at the backside with a uniform thickness to further reduce bowing from the encapsulant in the frontside cavity.

* * * * *